(12) United States Patent
Kweon et al.

(10) Patent No.: US 9,316,381 B2
(45) Date of Patent: *Apr. 19, 2016

(54) BACKLIGHT UNIT AND LIQUID CRYSTAL DISPLAY DEVICE INCLUDING THE SAME

(71) Applicant: LG DISPLAY CO., LTD., Seoul (KR)

(72) Inventors: Young-Min Kweon, Gumi-si (KR); Ji-Woon Min, Gumi-si (KR); Ho-Young Cheon, Goseong-gun (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/630,255

(22) Filed: Feb. 24, 2015

(65) Prior Publication Data

US 2015/0167939 A1 Jun. 18, 2015

Related U.S. Application Data

(63) Continuation of application No. 13/339,000, filed on Dec. 28, 2011, now Pat. No. 9,016,921.

(30) Foreign Application Priority Data

Apr. 14, 2011 (KR) .................. 10-2011-0034708

(51) Int. Cl.
| | | |
|---|---|---|
| *F21V 19/00* | (2006.01) | |
| *G02F 1/1333* | (2006.01) | |
| *G02F 1/1335* | (2006.01) | |
| *F21V 8/00* | (2006.01) | |
| *F21Y 103/00* | (2006.01) | |

(52) U.S. Cl.
CPC .......... *F21V 19/0025* (2013.01); *G02B 6/0051* (2013.01); *G02B 6/0073* (2013.01); *G02B 6/0091* (2013.01); *G02F 1/133308* (2013.01); *F21Y 2103/003* (2013.01); *G02B 6/0083* (2013.01); *G02B 6/0093* (2013.01); *G02F 1/133603* (2013.01); *G02F 1/133615* (2013.01); *G02F 2001/13332* (2013.01); *G02F 2001/133314* (2013.01); *H05K 2201/10106* (2013.01)

(58) Field of Classification Search
CPC .................... G02F 1/133603; G02F 1/133615; G02B 6/0083; G02B 6/009; H05K 2201/10106
See application file for complete search history.

(56) References Cited

U.S. PATENT DOCUMENTS

| | | | |
|---|---|---|---|
| 6,999,318 | B2 | 2/2006 | Newby |
| 7,436,000 | B2 | 10/2008 | Kim et al. |
| 7,547,924 | B1 | 6/2009 | Lin |
| 8,035,984 | B2 | 10/2011 | Ratcliffe |
| 2006/0163596 | A1 | 7/2006 | Kim et al. |

(Continued)

FOREIGN PATENT DOCUMENTS

| | | |
|---|---|---|
| CN | 1743919 A | 3/2006 |
| CN | 101566290 A | 10/2009 |
| WO | 2004-105142 A1 | 12/2004 |

*Primary Examiner* — Paisley L Arendt
(74) *Attorney, Agent, or Firm* — Dentons US LLP

(57) ABSTRACT

A light emitting diode assembly includes: a light emitting diode (LED) printed circuit board (PCB) having a base layer, an insulating layer on the base layer and a circuit pattern layer on the insulating layer, the LED PCB including a plurality of through holes spaced apart from each other; and a plurality of light emitting diodes (LEDs) inserted into the plurality of through holes, respectively, from a bottom surface of the LED PCB, each of the plurality of LEDs including a lead contacting the circuit pattern layer.

7 Claims, 6 Drawing Sheets

(56) References Cited

U.S. PATENT DOCUMENTS

| | | |
|---|---|---|
| 2007/0121023 A1 | 5/2007 | Yang |
| 2008/0180972 A1* | 7/2008 | Sakamoto et al. ............ 362/613 |
| 2009/0020774 A1 | 1/2009 | Park |
| 2009/0268434 A1 | 10/2009 | Mita et al. |
| 2010/0165601 A1 | 7/2010 | Yoon et al. |

* cited by examiner

BACKLIGHT UNIT AND LIQUID CRYSTAL DISPLAY DEVICE INCLUDING THE SAME

This application is a continuation of U.S. patent application Ser. No. 13/339,000 filed Dec. 28, 2011, and claims the benefit of Korean Patent Application No. 10-2011-0034708, filed on Apr. 14, 2011, both of which are hereby incorporated by reference in their entirety.

BACKGROUND OF THE INVENTION

1. Field of the Invention

The present invention relates to a liquid crystal display device, and more particularly, to a liquid crystal display device having a narrow bezel region due to a light emitting diode (LED) backlight unit.

2. Discussion of the Related Art

A liquid crystal display (LCD) device that has been widely used for a television or a monitor because of its superiority in displaying a moving image and high contrast ratio produces images by using optical anisotropy and polarization properties of liquid crystal molecules. The LCD device includes a liquid crystal panel that is composed of facing two substrates and a liquid crystal layer between the two substrates. An alignment direction of liquid crystal molecules in the liquid crystal panel is changed by an electric field so that the liquid crystal panel can produce difference in transmittance.

Since the LCD device is a non-emissive type display device, an additional light source is required. Accordingly, a backlight unit including a light source is disposed under the liquid crystal panel. The backlight unit may be classified into a direct type and an edge type according to a position of the light source. In the direct type backlight unit, the light source is disposed under the liquid crystal panel and the light from the light source is directly supplied to the liquid crystal panel. In the edge type backlight unit, a light guide plate is disposed under the liquid crystal panel and the light source is disposed at a side of the light guide plate so that the light from the light source can be indirectly supplied to the liquid crystal panel using refraction and reflection in the light guide plate.

Here, one of a cold cathode fluorescent lamp (CCFL), an external electrode fluorescent lamp (EEFL) and a light emitting diode (LED) may be used as the light source. Specifically, the LED has been widely used as a light source for a display device because of its advantages such as small size, low power consumption and high reliability.

FIG. 1 is a perspective view showing a light emitting diode assembly of a backlight unit according to the related art, and FIG. 2 is a cross-sectional view showing a liquid crystal display device including a backlight unit according to the related art. In FIG. 1, a light emitting diode (LED) assembly 29 includes a plurality of LEDs 29a and an LED printed circuit board (PCB) 29b where the plurality of LEDs 29a are mounted. The plurality of LEDs 29a area spaced apart from each other. Leads 29a-1 are formed at both sides of each of the plurality of LEDs 29a and a circuit pattern 29b-1 is formed on the LED PCB 29b. The leads 29a-1 are electrically connected to the circuit pattern 29b-1 by soldering. A backlight unit 20 (of FIG. 2) of a liquid crystal display (LCD) device 1 (of FIG. 2) may include the LED assembly 29 as a light source.

In FIG. 2, an LCD device 1 includes a liquid crystal panel 10, a backlight unit 20, a main frame 30, a top frame 40 and a bottom frame 50. The liquid crystal panel 10 displaying an image includes first and second substrates 12 and 14 facing and spaced apart from each other and a liquid crystal layer (not shown) interposed therebetween. The liquid crystal panel 10 further includes first and second polarizing plates 19a and 19b on outer surfaces of the first and second substrates 12 and 14, respectively.

The liquid crystal panel 10 and the backlight unit 20 are integrated by the main frame 30, the top frame 40 and the bottom frame 50. The main frame 30 having a rectangular ring shape surrounds an edge portion of the liquid crystal panel 10 and the backlight unit 20. In addition, the top frame 40 covers a front edge portion of the liquid crystal panel 10 and the bottom frame 50 covers a rear surface of the backlight unit 20.

The backlight unit 20 is disposed under the liquid crystal panel 10. The backlight unit 20 includes a light emitting diode (LED) assembly 29, a reflecting plate 25, a light guide plate 23 and a plurality of optical sheets 21. The LED assembly 29 is disposed under the main frame 30 and the reflecting plate 25 having a white color or a silver color is disposed over the bottom frame 50. In addition, the light guide plate 23 is disposed over the reflecting plate 25 and the plurality of optical sheets 21 are disposed over the light guide plate 23.

The LED assembly 29 of the backlight unit 20 includes a plurality of LEDs 29a emitting a white-colored light and an LED PCB 29b where the plurality of LEDs 29a are formed. A temperature of the plurality of LEDs 29a increases according to an operating time and a brightness of the plurality of LEDs 29a is changed according to the temperature of the plurality of LEDs 29a. Specifically, when a heat generated by the plurality of LEDs 29a is not efficiently dissipated, a color of light emitted from the plurality of LEDs 29a may be changed. In addition, brightness of the light emitted from the plurality of LEDs 29a may decrease and lifetime of the LED assembly 29 may be reduced.

Accordingly, the LED PCB 29b is fabricated so that the heat can be dissipated from the plurality of LEDs 29a. Although the heat may be directly dissipated from the plurality of LEDs 29a to the external air, the heat dissipation efficiency from the plurality of LEDs 29a to the external air is smaller than the heat dissipation efficiency from the plurality of LEDs 29a through the LED PCB 29b. As a result, since most heat of the plurality of LEDs 29a on the LED PCB 29b is dissipated from the plurality of LEDs 29a through the LED PCB 29b, the heat dissipation of the LED assembly 29 has a limitation.

The plurality of LEDs 29a of the LED assembly 29 face an incident surface of the light guide plate 23 such that a top surface of each of the plurality of LEDs 29a is spaced apart from the incident surface by a first gap distance A1 and a top surface of the LED PCB 29b is spaced apart from the incident surface by a second gap distance A2. The second gap distance A2 corresponds to a sum of the first gap distance A1 and a width of each of the plurality of LEDs 29a. The separation between the LED assembly 29 and the light guide plate 23 by the first gap distance A1 is required for protecting the plurality of LEDs 29a by preventing contact between the incident surface and the plurality of LEDs 29a even when the light guide plate 23 expands toward the LED assembly 29 by a heat.

However, since the LED assembly 29 is separated from the light guide plate 23 by the first gap distance A1, the whole light from the plurality of LEDs 29a of the LED assembly 29 does not enter the incident surface of the light guide plate 23 such that a portion of the light is lost.

Recently, the LCD device having a wide display area and a narrow bezel region has been widely researched for a portable computer, a desktop computer and a wall-hanging television. However, since the LED assembly 29 is separated from the light guide plate 23 by the first gap distance A1, it is difficult to reduce a width W of the bezel region corresponding to a sum of the first gap distance A1, the thickness of each LED 29a and the thickness of the LED PCB 29b in the LCD device 1.

SUMMARY OF THE INVENTION

Accordingly, the present invention is directed to a backlight unit and a liquid crystal display device including the same that substantially obviate one or more of the problems due to limitations and disadvantages of the related art.

An advantage of the present invention is to provide a backlight unit where a gap distance between a plurality of LEDs and a light guide plate is reduced by forming the plurality of LEDs inside an LED PCB and a liquid crystal display device including the backlight unit.

Another advantage of the present invention is to provide a backlight unit where an incident efficiency of light to the light guide plate is improved and a width of a bezel region is reduced and a liquid crystal display device including the backlight unit.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a light emitting diode assembly includes: an LED printed circuit board (PCB) comprising from the top down a base layer, an insulating layer, a circuit pattern layer and a protecting layer, wherein the LED PCB includes along its longitude direction a plurality of through holes spaced from each other; a plurality of LEDs, inserted from the bottom of the LED PCB into the plurality of through holes, respectively, wherein the plurality of LEDs comprise leads on both sides of the plurality of LEDs, wherein the plurality of LEDs are electrically connected to the LED PCB through the leads.

In another aspect, a light emitting diode assembly includes: a light emitting diode (LED) printed circuit board (PCB) having a base layer, an insulating layer on the base layer and a circuit pattern layer on the insulating layer, the LED PCB including a plurality of through holes spaced apart from each other; and a plurality of light emitting diodes (LEDs) inserted into the plurality of through holes, respectively, from a bottom surface of the LED PCB, each of the plurality of LEDs including a lead contacting the circuit pattern layer.

In another aspect, a liquid crystal display device includes: a backlight unit having a reflecting plate, a light guide plate over the reflecting plate, a light emitting diode (LED) assembly along at least one side of the light guide plate and a plurality of optical sheets over the light guide plate; a liquid crystal panel over the backlight unit and displaying an image; a main frame surrounding an edge portion of the liquid crystal panel and the backlight unit; a top frame covering a front edge portion of the liquid crystal panel; and a bottom frame covering a rear surface of the backlight unit, wherein the LED assembly includes: an LED printed circuit board (PCB) having a base layer, an insulating layer on the base layer and a circuit pattern layer on the insulating layer, the LED PCB including a plurality of through holes spaced apart from each other; and a plurality of light emitting diodes (LEDs) inserted into the plurality of through holes, respectively, from a bottom surface of the LED PCB, each of the plurality of LEDs including a lead contacting the circuit pattern layer.

In another aspect, a liquid crystal display device includes: a backlight unit having a light emitting diode (LED) assembly, a light guide plate over the LED assembly and a plurality of optical sheets over the light guide plate; a liquid crystal panel over the backlight unit and displaying an image; a main frame surrounding an edge portion of the liquid crystal panel and the backlight unit; a top frame covering a front edge portion of the liquid crystal panel; and a bottom frame covering a rear surface of the backlight unit, wherein the LED assembly includes: an LED printed circuit board (PCB) having a base layer, an insulating layer on the base layer and a circuit pattern layer on the insulating layer, the LED PCB including a plurality of through holes spaced apart from each other; and a plurality of light emitting diodes (LEDs) inserted into the plurality of through holes, respectively, from a bottom surface of the LED PCB, each of the plurality of LEDs including a lead contacting the circuit pattern layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, similar reference numbers will be used to refer to the same or similar parts.

Figure 1:
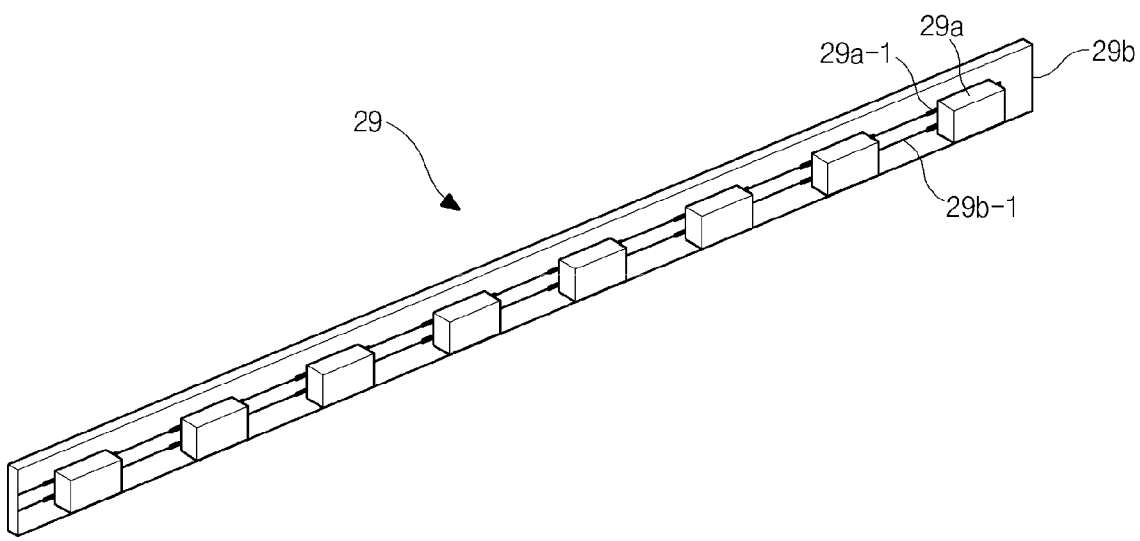
FIG. 1 is a perspective view showing a light emitting diode assembly of a backlight unit according to the related art.
Figure 2:
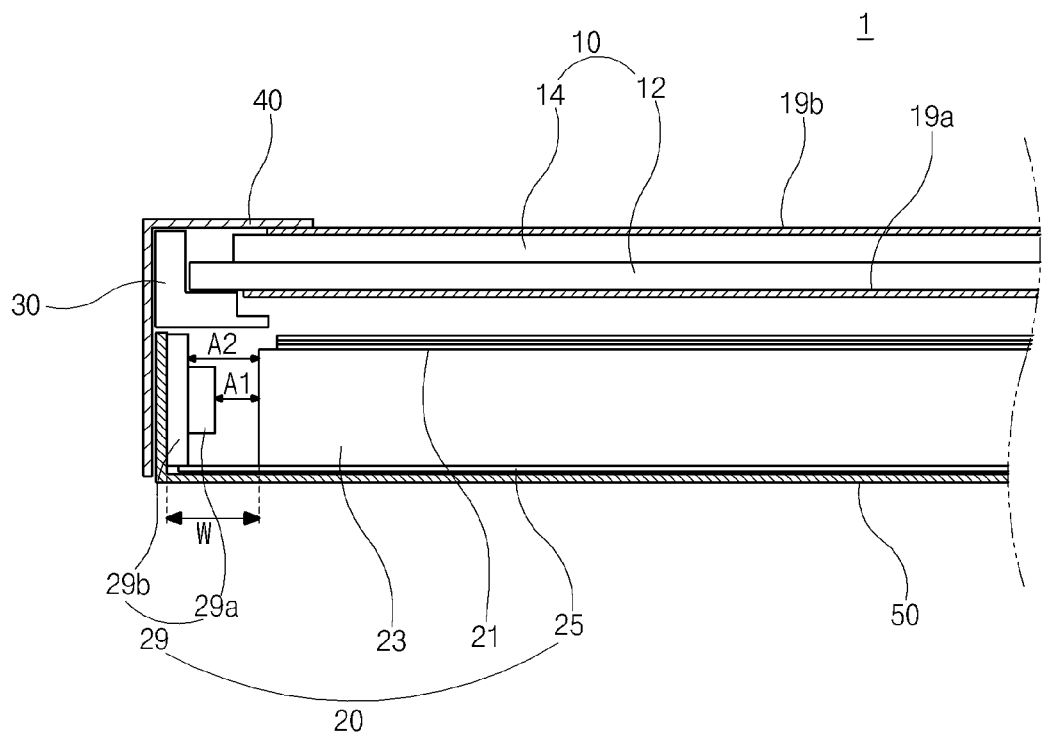
FIG. 2 is a cross-sectional view showing a liquid crystal display device including a backlight unit according to the related art.
Figure 3:
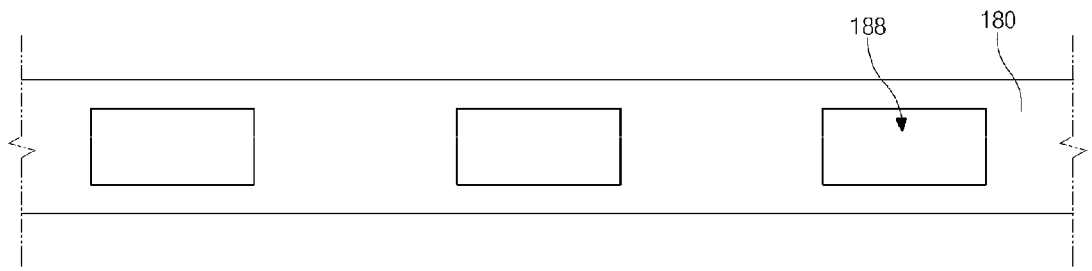
FIG. 3 is a plan view showing a light emitting diode printed circuit board for a light emitting diode assembly of a backlight unit according to a first embodiment of the present invention.
Figure 4:
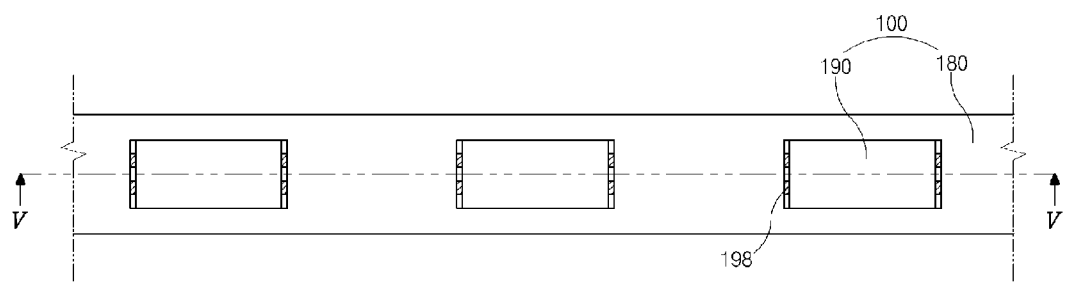
FIG. 4 is a plan view showing a light emitting diode assembly of a backlight unit according to a first embodiment of the present invention.

FIG. 3 is a plan view showing a light emitting diode printed circuit board for a light emitting diode assembly of a backlight unit according to a first embodiment of the present invention, and FIG. 4 is a plan view showing a light emitting diode assembly of a backlight unit according to a first embodiment of the present invention.

In FIGS. 3 and 4, a light emitting diode (LED) printed circuit board (PCB) 180 having a longer side and a shorter side includes a plurality of through holes 188 for a plurality of LEDs 190. The plurality of through holes 188 are disposed along the longer side of the LED PCB 180 and spaced apart from each other. Each of the plurality of through holes 188 has a rectangular shape corresponding to each of the plurality of LEDs 190. In another embodiment, each of the plurality of through holes 188 may have various shapes according to the shape of each of the plurality of LEDs 190.

In addition, each of the plurality of through holes 188 has an area corresponding to each of the plurality of LEDs 190. For example, an area of each of the plurality of through holes 188 may be slightly greater than an area of each of the plurality of LEDs 190 so that the plurality of LEDs 190 can be easily inserted into or extracted from the plurality of through holes 188. Accordingly, the LED assembly 100 is formed by inserting the plurality of LEDs 190 into the plurality of through holes 188 of the LED PCB 180. Each of the plurality of LEDs 190 is electrically connected to the LED PCB 180 through leads 198.

Figure 5:
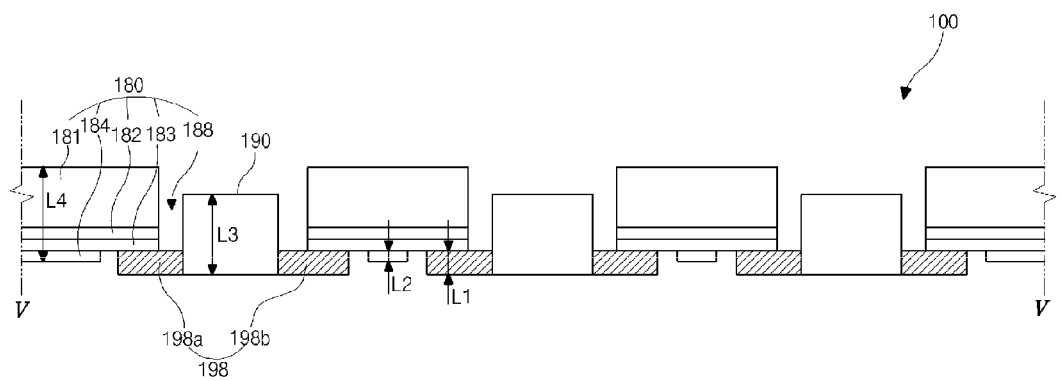
FIG. 5 is a cross-sectional view taken along a line V-V of FIG. 4.
Figure 6:
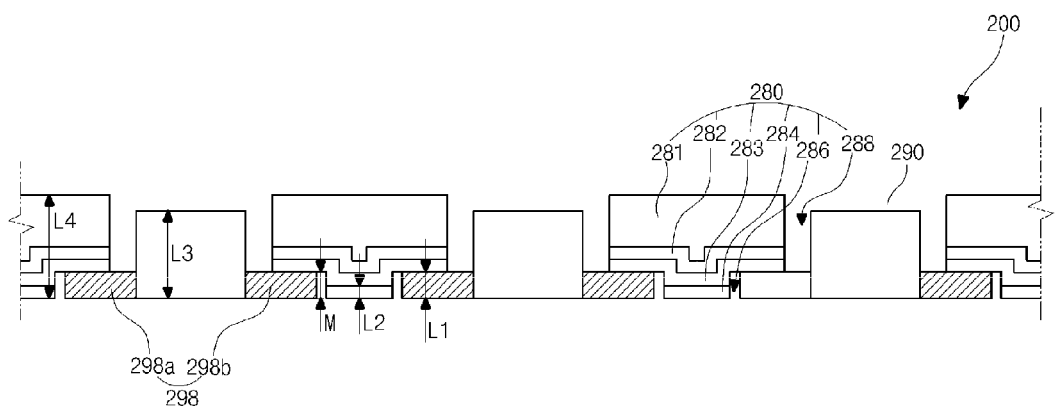
FIG. 6 is a cross-sectional view showing a light emitting diode assembly of a backlight unit according to a second embodiment of the present invention.

FIG. 5 is a cross-sectional view taken along a line V-V of FIG. 4 and FIG. 6 is a cross-sectional view showing a light emitting diode assembly of a backlight unit according to a second embodiment of the present invention.

In FIG. 5, the LED PCB 180 includes a base layer 181, an insulating layer 182 on the base layer 181, a circuit pattern layer 183 on the insulating layer 182 and a protecting layer 184 on the circuit pattern layer 183. In addition, the plurality of through holes 188 are formed in the LED PCB 180 and are disposed along the longer side of the LED PCB 180. The LED assembly 100 includes the LED PCB 180 and the plurality of LEDs 190 inserted into the plurality of through holes 188 of the LED PCB 180.

Each of the plurality of LEDs 190 may include a light emitting portion (not shown) having an LED chip substantially emitting light, a lens (not shown) that surrounds and protects the light emitting portion and diffuses the light from the light emitting portion and leads 198 for electrically connecting the light emitting portion and an external power source. For example, each of the plurality of LEDs 190 may have a pair of cathode leads 198a and a pair of anode leads 198b at both sides thereof, respectively. As a result, at least one anode lead 198a is formed at one side of each of the plurality of LEDs 190 and at least one cathode lead 198b is formed at the other side of each of the plurality of LEDs 190. The positions of the at least one anode lead 198a and the at least one cathode lead 198b may be switched.

The base layer 181 may include a metallic material having a relatively high heat conductivity such as silicon (Si), zinc (Zn) and aluminum (Al) so that the heat from the plurality of LEDs 190 can be effectively dissipated. The LED PCB 180 including the base layer 181 of a metallic material such as silicon (Si), zinc (Zn) and aluminum (Al) may be referred to as a metal printed circuit board (MPCB) or a metal core printed circuit board (MCPCB). Alternatively, the LED PCB 180 may be one of an FR-4 (flame retardant composition 4) PCB having a heat conduction material, a ceramic printed circuit board and a flexible printed circuit board (FPCB).

The insulating layer 182 electrically separates the base layer 181 and the circuit pattern layer 183. The circuit pattern layer 183 may include a metallic material such as copper (Cu) and contact the leads 198 of each of the plurality of LEDs 190 to supply an electric power from the external power source. As a result, the circuit pattern layer 183 of the LED PCB 180 receives the operation current for emitting light from the external power source and supplies the operation current to the plurality of LEDs 190.

The protecting layer 184 protects the circuit pattern layer 183 and prevents discoloration of the circuit pattern layer 183. The protecting layer 184 is formed except for an boundary portion of each of the plurality of through holes 188 such that a portion of the circuit pattern layer 183 is exposed through the protecting layer 184. The exposed portion of the circuit pattern layer 183 through the protecting layer 184 is used for connection with the leads 198 so that the leads 198 of each of the plurality of LEDs 190 can contact the circuit pattern layer 183 of the LED PCB 180. The protecting layer 184 may include a photosensitive epoxy or a photo solder resist (PSR).

The plurality of LEDs 190 are inserted into the plurality of through holes 188, respectively, of the LED PCB 180 and the leads 198 of each of the plurality of LEDs 190 contact the circuit pattern layer 183 of the LED PCB 180. In addition, the leads 198 of each of the plurality of LEDs 190 are electrically connected to the circuit pattern layer 183 of the LED PCB 180 through a solder. Here, since a first thickness L1 of the leads 198 of each of the plurality of LEDs 190 is greater than a second thickness L2 of the protecting layer 184 of the LED PCB 180, a portion of the leads 198 corresponding to difference (L1−L2) between the first and second thicknesses L1 and L2 protrudes outside a bottom surface of the LED PCB 180. Accordingly, each of the plurality of LEDs 190 partially protrudes from the bottom surface of the LED PCB 180.

A third thickness L3 of each of the plurality of LEDs 190 is smaller than a fourth thickness L4 of the LED PCB 180. For example, the third thickness L3 may be about 0.8 mm and the fourth thickness L4 may be about 1 mm. Accordingly, when the plurality of LEDs 190 are inserted into the plurality of through holes 188 upwardly from a bottom surface of the LED PCB 180, a top surface of each of the plurality of LEDs 190 is located at a lower position than a top surface of the LED PCB 180. Specifically, since the portion of the leads 198 of the plurality of LEDs 190 protrudes outside the bottom surface of the LED PCB 180, the top surface of each of the plurality of LEDs 190 is disposed further lower than the top surface of the LED PCB 180.

In addition, since the plurality of LEDs 190 are inserted into the plurality of through holes 188, respectively, the plurality of LEDs 190 are disposed closer to the base layer 181. Since the base layer 181 includes a metallic material, the heat from the plurality of LEDs 190 may be further efficiently dissipated through the base layer 181. Since the heat from the plurality of LEDs 190 inserted into the plurality of through holes 188 is dissipated through top and side surfaces of the plurality of LEDs 190, the heat dissipation is improved as compared with the related art LED assembly. As a result, discoloration and display quality degradation are prevented and lifetime of the plurality of LEDs 190 is improved.

In FIG. 6, leads 298 of a plurality of LEDs 290 do not protrude outside a bottom surface of an LED PCB 280. The LED PCB 280 includes a base layer 281, an insulating layer 282 on the base layer 281, a circuit pattern layer 283 on the insulating layer 282 and a protecting layer 284 on the circuit pattern layer 283. In addition, a plurality of through holes 288 are formed in the LED PCB 280 and are disposed along the longer side of the LED PCB 280. A lead groove 286 surrounding each of the plurality of through holes 288 is formed such that each of base layer 281, the insulating layer 282 and the circuit pattern layer 283 has a step difference.

An LED assembly 200 includes the LED PCB 280 and the plurality of LEDs 290 inserted into the plurality of through holes 288 of the LED PCB 280. The base layer 281 may include a metallic material having a relatively high heat conductivity such as silicon (Si), zinc (Zn) and aluminum (Al) so that the heat from the plurality of LEDs 290 can be effectively dissipated. The LED PCB 280 including the base layer 281 of a metallic material such as silicon (Si), zinc (Zn) and aluminum (Al) may be referred to as a metal printed circuit board (MPCB) or a metal core printed circuit board (MCPCB). Alternatively, the LED PCB 280 may be one of an FR-4 (flame retardant composition 4) PCB having a heat conduction material, a ceramic printed circuit board and a flexible printed circuit board (FPCB).

The insulating layer 282 electrically separates the base layer 281 and the circuit pattern layer 283. The circuit pattern layer 283 may include a metallic material such as copper (Cu) and contact the leads 298 of each of the plurality of LEDs 290 to supply an electric power from the external power source. As a result, the circuit pattern layer 283 of the LED PCB 280 receives the operation current for emitting light from the external power source and supplies the operation current to the plurality of LEDs 290.

The protecting layer 284 protects the circuit pattern layer 283 and prevents discoloration of the circuit pattern layer 283. The protecting layer 284 is formed except for the lead groove 286 of each of the plurality of through holes 288 such that the leads of each of the plurality of LEDs 290 correspond to the lead groove 286. Accordingly, the leads of each of the plurality of LEDs 290 contact the circuit pattern layer 283 in the lead groove 286. The protecting layer 284 may include a photosensitive epoxy or a photo solder resist (PSR).

The plurality of LEDs 290 are upwardly inserted into the plurality of through holes 288, respectively, of the LED PCB 280 from a bottom surface of the LED PCB 280 and the leads 298 of each of the plurality of LEDs 290 are disposed in the lead groove 286 of each of the plurality of through holes 288. Accordingly, the leads 298 of each of the plurality of LEDs 290 contact and are electrically connected to the circuit pattern layer 283 of the LED PCB 280 through a solder.

Since the leads 298 of each of the plurality of LEDs 290 are disposed in the lead groove 286 of each of the plurality of through holes 288, the leads 298 do not protrude outside the bottom surface of the LED PCB 280. For example, the leads 298 may be flush with the bottom surface of the LED PCB 280. In addition, a depth M of the lead groove 286 may be the same as a first thickness L1 of the leads 298 of each of the plurality of LEDs 290. Alternatively, the depth M of the lead groove 286 may be the same as a sum of the first thickness L1 of the leads 298 and the solder (not shown).

A third thickness L3 of each of the plurality of LEDs 290 is smaller than a fourth thickness L4 of the LED PCB 280. For example, the third thickness L3 may be about 0.8 mm and the fourth thickness L4 may be about 1 mm. Accordingly, when the plurality of LEDs 290 are inserted into the plurality of through holes 288 upwardly from the bottom surface of the LED PCB 280, a top surface of each of the plurality of LEDs 290 is located at a lower position than a top surface of the LED PCB 280.

In addition, since the plurality of LEDs 290 are inserted into the plurality of through holes 288, respectively, the plurality of LEDs 290 are disposed closer to the base layer 281. Since the base layer 281 includes a metallic material, the heat from the plurality of LEDs 290 may be further efficiently dissipated through the base layer 281. Since the heat from the plurality of LEDs 290 inserted into the plurality of through holes 288 is dissipated through top and side surfaces of the plurality of LEDs 290, the heat dissipation is improved as compared with the related art LED assembly. As a result, discoloration and display quality degradation are prevented and lifetime of the plurality of LEDs 290 is improved.

Figure 7:
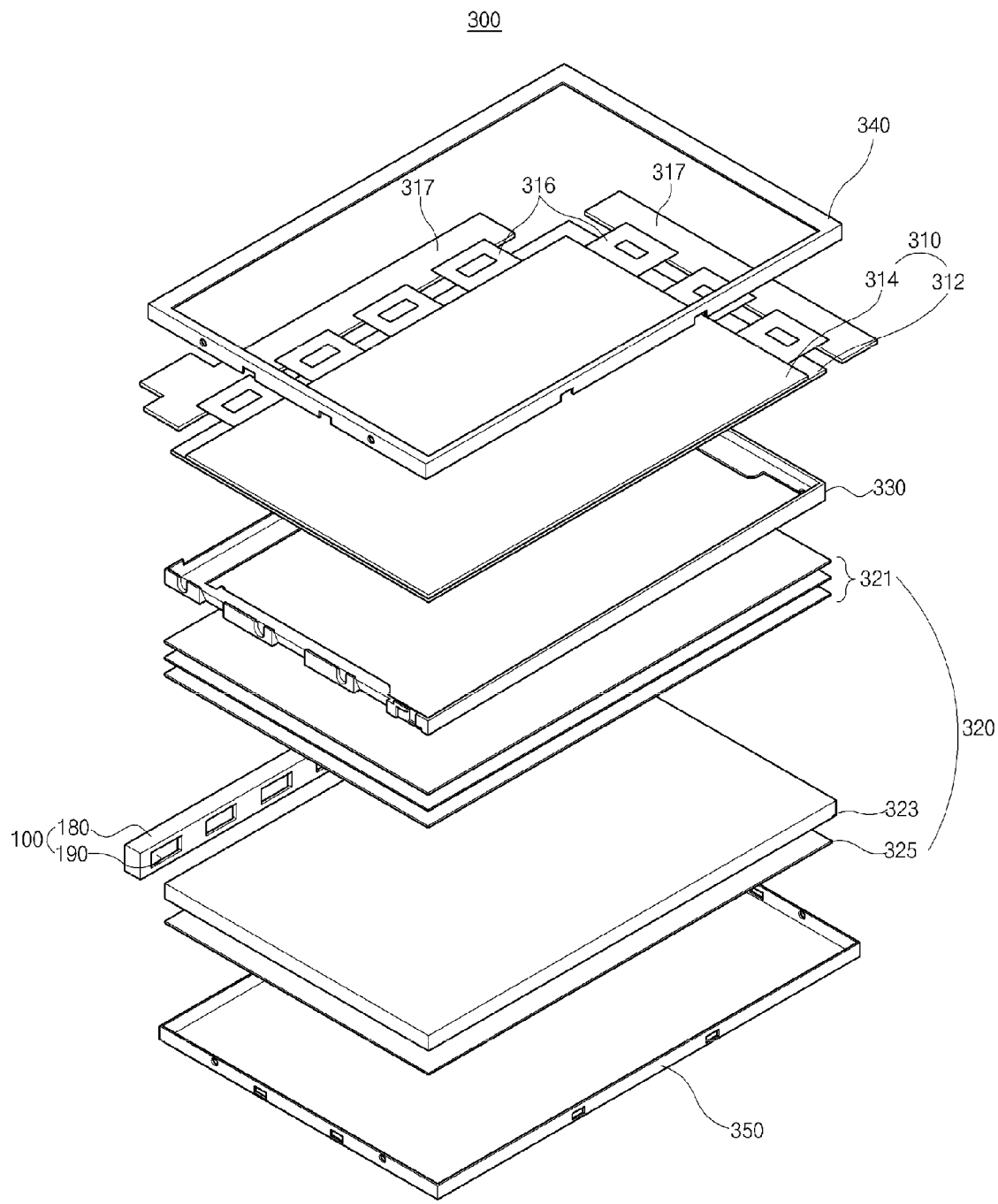
FIG. 7 is an exploded perspective view showing a liquid crystal display device including a light emitting diode assembly according to a first embodiment of the present invention.
Figure 8:
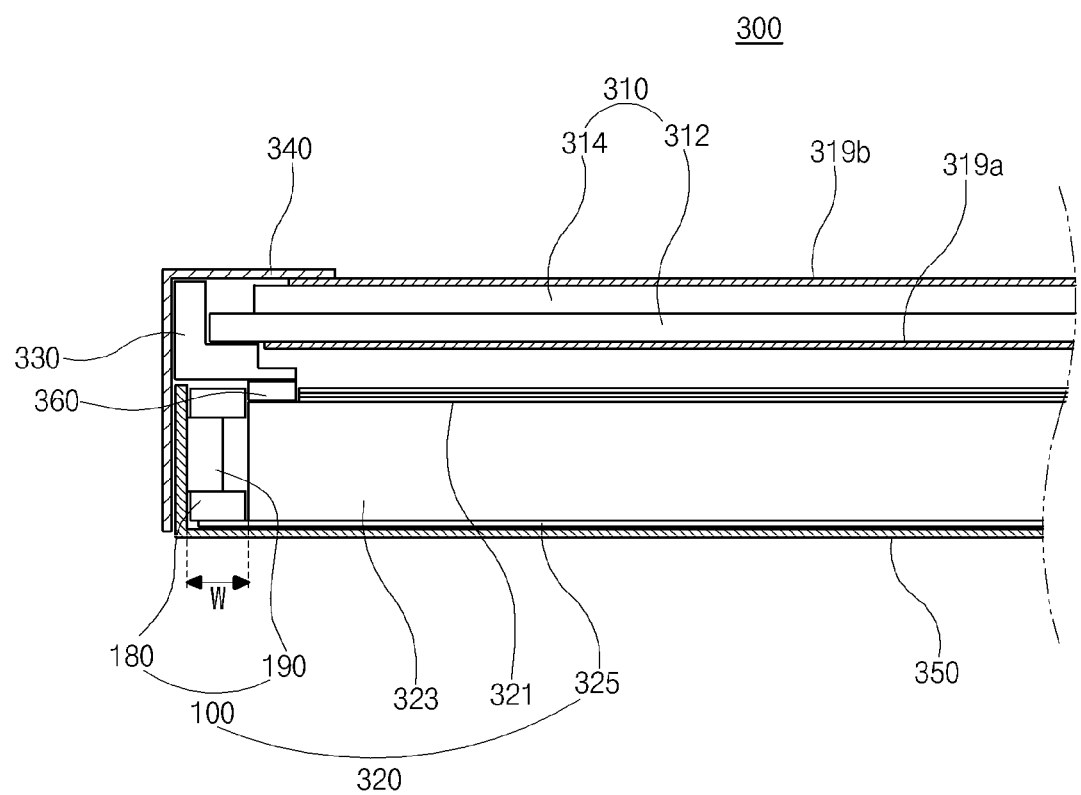
FIG. 8 is a cross-sectional view, respectively, showing a liquid crystal display device including a light emitting diode assembly according to a first embodiment of the present invention.

FIGS. 7 and 8 are an exploded perspective view and a cross-sectional view, respectively, showing a liquid crystal display device including a light emitting diode assembly according to a first embodiment of the present invention.

In FIGS. 7 and 8, a liquid crystal display (LCD) device 300 includes a liquid crystal panel 310, a backlight unit 320, a main frame 330, a top frame 340 and a bottom frame 350. The liquid crystal panel 310 displaying an image includes first and second substrates 312 and 314 facing and spaced apart from each other and a liquid crystal layer (not shown) interposed therebetween. Although not shown, when the liquid crystal panel 310 has an active matrix type, a gate line, a data line, a thin film transistor (TFT) and a pixel electrode may be formed on an inner surface of the first substrate 312 referred to as a lower substrate or an array substrate. In addition, a color filter layer, a black matrix and a common electrode may be formed on an inner surface of the second substrate 314 referred to as an upper substrate or a color filter substrate. The gate line and the data line cross each other to define a pixel region and the TFT is connected to the gate line and the data line. Further, the pixel electrode is connected to the TFT. The color filter layer includes red, green and blue color filters each corresponding to the pixel region and the black matrix covers the gate line, the data line and the TFT. Moreover, the common electrode is formed on the color filter layer and the black matrix. The liquid crystal panel 310 further includes first and second polarizing plates 319a and 319b where a predetermined polarized light selectively passes on outer surfaces of the first and second substrates 312 and 314, respectively.

A printed circuit board (PCB) 317 is connected to at least one side of the liquid crystal panel 310 through a connecting means 316 such as a flexible circuit board (FPC) or a tape carrier package (TCP). The PCB 317 may be bent toward a side surface or a rear surface of the main frame 230 during integration.

When the TFT connected to the gate line is turned on by a gate signal of a gate driving circuit, a data signal of a data driving circuit is applied to the pixel electrode through the data line and an alignment direction of liquid crystal molecules of the liquid crystal layer is changed by an electric field generated between the pixel electrode and the common electrode. As a result, the liquid crystal panel 110 produces transmittance difference and displays images.

The backlight unit 320 is disposed under the liquid crystal panel 310. The backlight unit 320 includes a light emitting diode (LED) assembly 100, a reflecting plate 325, a light guide plate 323 and a plurality of optical sheets 321. The LED assembly 100 is disposed along at least one side of the main frame 330 and the reflecting plate 325 having a white color or a silver color is disposed over the bottom frame 350. In addition, the light guide plate 323 is disposed over the reflecting plate 325 and the plurality of optical sheets 321 are disposed over the light guide plate 323.

The LED assembly 100 of the backlight unit 320 includes a plurality of LEDs 190 emitting a white-colored light and an LED PCB 180 where the plurality of LEDs 190 are inserted into a plurality of through holes 188 (of FIG. 5) of the LED PCB 180. The LED assembly 100 may be fixed by an adhesion and the LED PCB 180 may contact an incident surface of the light guide plate 323 so that the whole light from the plurality of LEDs 190 can enter the light guide plate 323 through the incident surface. Since the whole light from the plurality of LEDs 190 is supplied to the liquid crystal panel 310 by refraction and reflection in the light guide plate 323 without light leakage, brightness of the LCD device 300 is improved.

In addition, since the top surface of the plurality of LEDs 190 is disposed inside the top surface of the LED PCB 180, the plurality of LEDs 190 do not contact the light guide plate 323 even when the light guide plate 323 expands toward the LED assembly 100 by an ambient heat. As a result, the plurality of LEDs 190 and the light guide plate 323 are protected from the thermal expansion of the light guide plate 323.

In the LCD device 300, since the plurality of LEDs 190 are formed in the LED PCB 180, the bezel region of the LCD device 300 has a width W corresponding to a sum of the fourth thickness L4 (of FIG. 5) of the LED PCB 180 and the difference (L1−L2) between the first and second thickness L1 and L2 (of FIG. 5). Accordingly, the width W of the bezel region is reduced as compared with the related art LCD device.

Moreover, when the LED assembly according to the second embodiment of FIG. 6 is adopted, the bezel region of the LCD device has a width corresponding to fourth thickness L4 (of FIG. 6). Accordingly, the width of bezel region is further reduced.

Although not shown, the LED assembly 100 may further include an LED driving integrated circuit (IC) for driving the plurality of LEDs 190. The reflecting plate 325 is disposed under the light guide plate 323 and reflects the light passing through a bottom surface of the light guide plate 323 toward the liquid crystal panel 310 to improve brightness and efficiency of the light. The light emitted from the plurality of LEDs 190 enters the light guide plate 323 and is uniformly diffused in the whole light guide plate 323 by total reflection so that a planar light can be supplied to the liquid crystal panel 310. For the purpose of supplying a uniform planar light, the light guide plate 323 may include a uniformity pattern on the bottom surface thereof. For example, one of an elliptical pattern, a polygonal pattern and a hologram pattern may be formed on the bottom surface of the light guide plate 323 as the uniformity pattern to guide the light entering the light guide plate 323 and the uniformity pattern may be formed by a printing method or an injecting method.

The plurality of optical sheets 321 over the light guide plate 323 may include a diffusing sheet and at least one collimating sheet. The plurality of optical sheets 321 may diffuse or collimate the light passing through the light guide plate 323 to improve uniformity of the planar light. As a result, the light from the plurality of LEDs 190 becomes the planar light through the light guide plate 323 and the planar light enters the liquid crystal panel 310 through the plurality of optical sheets 321. Further, the liquid crystal panel 310 displays an image of high brightness using the planar light.

The liquid crystal panel 310 and the backlight unit 320 are integrated by the main frame 330, the top frame 340 and the bottom frame 350. The main frame 330 having a rectangular ring shape surrounds an edge portion of the liquid crystal panel 310 and the backlight unit 320. In addition, the top frame 340 covers a front edge portion of the liquid crystal panel 310 and the bottom frame 350 covers a rear surface of the backlight unit 320.

A pad 360 may be formed along at least one side between the main frame 330 and the light guide plate 323 of the backlight unit 320 to prevent movement of the light guide plate 323. Specifically, when the light guide plate 323 expands due to the heat, the pad 360 prevents an edge portion of the light guide plate 323 from being bent toward the liquid crystal panel 310. The main frame 330 may be referred to as a guide panel, a main support or a mold frame and the top frame 340 may be referred to as a top case or a case top. In addition, the bottom frame 350 may be referred to as a bottom cover or a lower cover.

Figure 9:
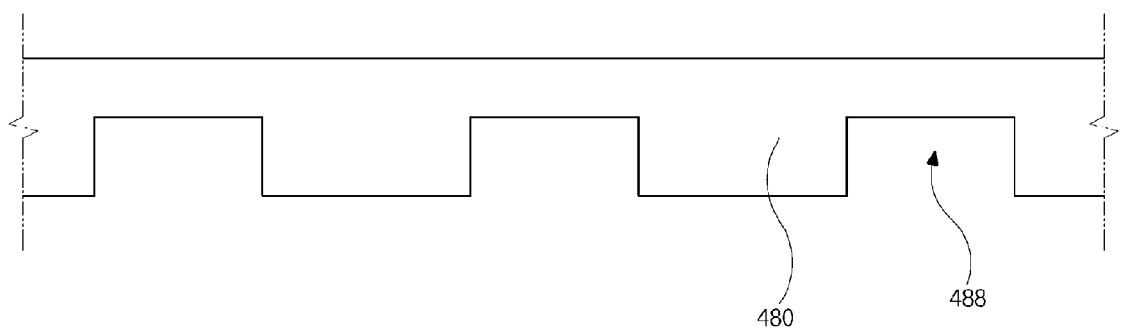
FIG. 9 is a plan view showing a light emitting diode printed circuit board for a light emitting diode assembly of a backlight unit according to a third embodiment of the present invention.
Figure 10:
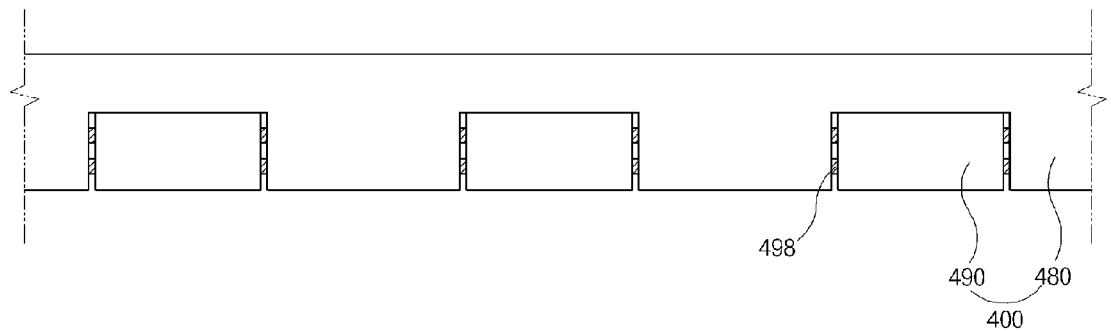
FIG. 10 is a plan view showing a light emitting diode assembly of a backlight unit according to a third embodiment of the present invention.

FIG. 9 is a plan view showing a light emitting diode printed circuit board for a light emitting diode assembly of a backlight unit according to a third embodiment of the present invention, and FIG. 10 is a plan view showing a light emitting diode assembly of a backlight unit according to a third embodiment of the present invention.

In FIGS. 9 and 10, a light emitting diode (LED) printed circuit board (PCB) 480 having a longer side and a shorter side includes a plurality of through holes 488 for a plurality of LEDs 490. The plurality of through holes 488 are disposed along the longer side of the LED PCB 480 and spaced apart from each other. Each of the plurality of through holes 488 has an open rectangular shape whose one side coincides with the longer side of the LED PCB 480 and that corresponds to each of the plurality of LEDs 490. In another embodiment, each of the plurality of through holes 488 may have various shapes according to the shape of each of the plurality of LEDs 490.

In addition, each of the plurality of through holes 488 has an area corresponding to each of the plurality of LEDs 490. For example, an area of each of the plurality of through holes 488 may be slightly greater than an area of each of the plurality of LEDs 490 so that the plurality of LEDs 490 can be easily inserted into or extracted from the plurality of through holes 488. Accordingly, the LED assembly 400 is formed by inserting the plurality of LEDs 490 into the plurality of through holes 488 of the LED PCB 480. Each of the plurality of LEDs 490 is electrically connected to the LED PCB 480 through leads 498.

Figure 11:
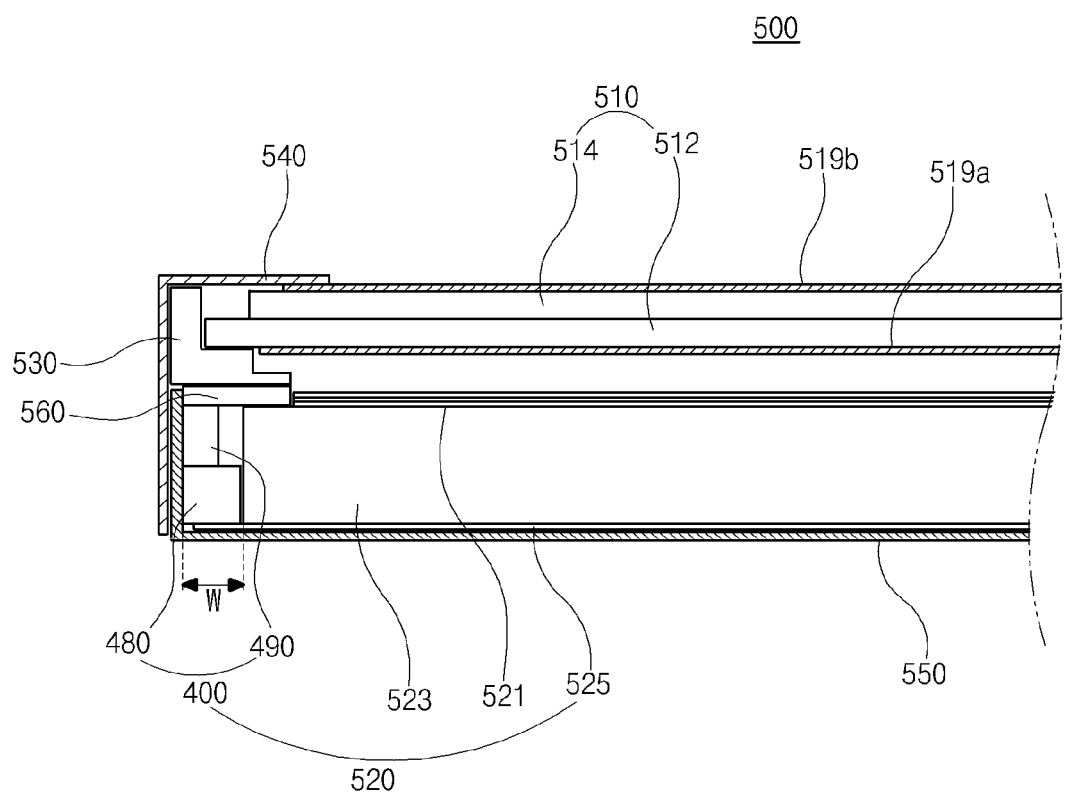
FIG. 11 is a cross-sectional view showing a liquid crystal display device including a light emitting diode assembly according to a third embodiment of the present invention.

FIG. 11 is a cross-sectional view showing a liquid crystal display device including a light emitting diode assembly according to a third embodiment of the present invention.

In FIG. 11, a liquid crystal display (LCD) device 500 includes a liquid crystal panel 510, a backlight unit 520, a main frame 530, a top frame 540 and a bottom frame 550. The liquid crystal panel 510 displaying an image includes first and second substrates 512 and 514 facing and spaced apart from each other and a liquid crystal layer (not shown) interposed therebetween. The liquid crystal panel 510 further includes first and second polarizing plates 519a and 519b where a predetermined polarized light selectively passes on outer surfaces of the first and second substrates 512 and 514, respectively.

The backlight unit 520 is disposed under the liquid crystal panel 510. The backlight unit 520 includes a light emitting diode (LED) assembly 400, a reflecting plate 525, a light guide plate 523 and a plurality of optical sheets 521. The LED assembly 400 is disposed along at least one side of the main frame 530 and the reflecting plate 525 having a white color or a silver color is disposed over the bottom frame 550. In addition, the light guide plate 523 is disposed over the reflecting plate 525 and the plurality of optical sheets 521 are disposed over the light guide plate 523.

The LED assembly 400 of the backlight unit 520 includes a plurality of LEDs 490 emitting a white-colored light and an LED PCB 480 where the plurality of LEDs 490 are inserted into a plurality of through holes 488 (of FIG. 10) of the LED PCB 480. The LED assembly 400 may be disposed to face at least one side (an incident surface) of the light guide plate 523. Since one side of each of the plurality of through holes 488 is open, one side of each of the plurality of LEDs 490 is exposed. Here, the exposed one side of each of the plurality of LEDs 490 is disposed to face the liquid crystal panel 510. As a result, an opaque pad 560 is formed between the main frame 530 and the light guide plate 523 of the backlight unit 520 more easily as compared with the first and second embodiments.

Further, since the pad 560 is disposed over the exposed one side of each of the plurality of LEDs 490 of the LED assembly 400 and the light guide plate 523, the pad 560 may guide the whole light from the plurality of LEDs 490 to the incident surface of the light guide plate 523.

In addition, the LED assembly 400 may be fixed by an adhesion and the LED PCB 480 may contact an incident surface of the light guide plate 523 so that the whole light from the plurality of LEDs 490 can enter the light guide plate 523 through the incident surface. Since the whole light from the plurality of LEDs 490 is supplied to the liquid crystal panel 510 by refraction and reflection in the light guide plate 523 without light leakage, brightness of the LCD device 500 is improved.

Although the LED assembly according to the present invention is applied to an edge type backlight unit in the first to third embodiments, the LED assembly according to the present invention may be applied to a direct type backlight unit. In the LCD device having a direct type backlight unit, since the LED assembly is disposed directly under the light guide plate and the LED PCB contacts the rear surface of the light guide plate, the whole light from the plurality of LEDs enters the light guide plate through the rear surface (incident surface) of the light guide plate. Further, he LED assembly according to the present invention may be applied to an LCD device having a main frame whose one side is open.

Consequently, in a liquid crystal display device according to the present invention, since the plurality of LEDs are formed in the LED PCB, a gap between the LED assembly and the light guide plate is reduced. Accordingly, the light from the plurality of LEDs enters the incident surface of the light guide plate without loss and the incident efficiency of light is improved. In addition, a width of a bezel region is reduced. Further, since the plurality of LEDs do not contact the light guide plate due to the LED PCB even when the light guide plate expands by heat, the plurality of LEDs and the light guide plate are protected.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light emitting diode (LED) backlight assembly comprising:
a light emitting diode (LED) printed circuit board (PCB) having a base layer, an insulating layer on only a lower surface of the base layer, and a circuit pattern layer, directly contacted with each other and arranged sequentially, and including a plurality of through holes spaced apart from each other; and
a plurality of light emitting diodes (LEDs) having electrode leads contacted with the circuit pattern layer and disposed in the plurality of through holes, respectively, wherein the plurality of light emitting diodes (LEDs) protrude from a bottom surface of the light emitting diode (LED) printed circuit board (PCB) without extending beyond a top surface of the light emitting diode (LED) printed circuit board (PCB).

2. The light emitting diode (LED) backlight assembly according to claim 1, wherein shapes of the base layer, the insulating layer and the circuit pattern layer are the same.

3. An apparatus comprising:
a light emitting diode (LED) assembly configured as an edge mount backlight for a display, wherein the light emitting diode assembly includes a light emitting diode (LED) printed circuit board having a base layer, an insulating layer on only a lower surface of the base layer, and a circuit pattern layer, directly contacted with each other and arranged sequentially, said LED assembly having recessed LED lamps with respective conductive leads, said recessed LED lamps and conductive leads not protruding beyond a bottom planar surface of said LED assembly; and
a light guide plate with a side edge that directly abuts with a top planar surface of said LED assembly in order to guide light from said recessed LED lamps via said top planar surface to pass through a top planar surface of said light guide plate and resulting in a bezel width that is reduced compared to a conventional LED assembly with protruding LED lamps attached to a conventional light guide plate that is spaced apart from said conventional LED assembly,
wherein the base layer is a metallic material that allows heat from said recessed LED lamps to dissipate.

4. The apparatus of claim 3, wherein said LED assembly has a height defined by a distance between said bottom planar surface and the top planar surface of said LED assembly, whereby said height corresponds to said bezel width of said display.

5. The apparatus of claim 4, wherein said base layer is configured in consideration of said side edge of said light guide plate being directly abutted with said top planar surface of said LED assembly and thus comprised of at least one among silicon, zinc and aluminum.

6. A light emitting diode (LED) backlight assembly comprising:
a light emitting diode (LED) printed circuit board (PCB) having a base layer, an insulating layer, a circuit pattern layer, and a protecting layer, directly contacted with each other and arranged sequentially, and including a plurality of through holes spaced apart from each other, wherein the protecting layer directly contacts a bottom surface of the circuit pattern layer except a boundary portion of each of the plurality of through holes; and
a plurality of light emitting diodes (LEDs) having electrode leads contacted with the circuit pattern layer at the boundary portion and disposed in the plurality of through holes, respectively, wherein a thickness of the electrode leads is greater than a thickness of the protecting layer of the LED PCB,
wherein the LED PCB has a plate shape such that a whole of a top surface of the base layer of the LED PCB is flat,
wherein a portion of the plurality of LEDs corresponding to a difference between the thickness of the electrode leads and the thickness of the protecting layer protrude from a bottom surface of the LED PCB without extending beyond the top surface of the base layer of the LED PCB.

7. An apparatus comprising:
a light emitting diode (LED) assembly configured as an edge mount backlight for a display, wherein the LED assembly includes a light emitting diode (LED) printed circuit board (PCB) and recessed LED lamps with respective conductive leads, wherein the LED PCB includes a base layer, an insulating layer, a circuit pattern layer, and a protecting layer, directly contacted with each other and arranged sequentially, and including a plurality of through holes for inserting the recessed LED lamps thereinto and a lead groove surrounding each of the through holes for inserting the conductive leads thereinto, wherein a depth of the lead groove is the same or greater than a thickness of the conductive leads, and wherein the conductive leads are not protruding beyond a bottom planar surface of the LED PCB of the LED assembly; and a light guide plate with a side edge that directly abuts with a top planar surface of said LED assembly in order to guide light from said recessed LED lamps via said top planar surface to pass through a top planar surface of said light guide plate and resulting in a bezel width that is reduced compared to a conventional LED assembly with protruding LED lamps attached to a conventional light guide plate that is spaced apart from said conventional LED assembly, wherein the base layer, the insulating layer, and the circuit pattern layer each has a step difference, and the protecting layer is on only a bottom surface of the circuit pattern layer except a portion of the lead groove of each of the plurality of through holes, and wherein the base layer of the LED PCB is a metallic material that allows heat from said recessed LED lamps to dissipate.

* * * * *